(12) United States Patent
Tansu et al.

(10) Patent No.: US 6,791,104 B2
(45) Date of Patent: Sep. 14, 2004

(54) TYPE II QUANTUM WELL OPTOELECTRONIC DEVICES

(75) Inventors: Nelson Tansu, Madison, WI (US); Luke J. Mawst, Sun Prairie, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 139 days.

(21) Appl. No.: 10/255,549

(22) Filed: Sep. 26, 2002

(65) Prior Publication Data

US 2004/0061102 A1 Apr. 1, 2004

(51) Int. Cl.$^7$ .............................................. H01L 29/06
(52) U.S. Cl. .......................... 257/14; 257/103; 372/44
(58) Field of Search ........................................ 257/14

(56) References Cited

U.S. PATENT DOCUMENTS

| | | | | |
|---|---|---|---|---|
| 5,383,211 A | * | 1/1995 | Van de Walle et al. | 372/43 |
| 5,727,013 A | | 3/1998 | Botez et al. | |
| 5,793,787 A | | 8/1998 | Meyer et al. | |
| 6,298,077 B1 | | 10/2001 | He | |
| 6,363,092 B1 | | 3/2002 | Botez et al. | |
| 6,396,865 B1 | | 5/2002 | Mawst et al. | |
| 6,621,842 B1 | * | 9/2003 | Dapkus | 372/45 |

FOREIGN PATENT DOCUMENTS

WO    WO 01/29943 A1    4/2001

OTHER PUBLICATIONS

H.C. Casey, Jr., "Temperature Dependence of the Threshold Current Density in InP–Ga$_{0.28}$In$_{0.72}$As$_{0.6}$P$_{0.4}$ (λ=1.3 μm) Double Heterostructure Lasers," J. Appl. Phys., vol. 56, No. 7, Oct. 1, 1984, pp. 1959–1964.

G. Ji, et al., "Band Lineup in GaAs$_{1-x}$Sb$_x$/GaAs Strained–Layer Multiple Quantum Wells Grown by Molecular–Beam Epitaxy," Physical Review B, vol. 38, No. 15, Nov. 15, 1988, pp. 10571–10577.

Chris G. Van de Walle, "Band Lineups and Deformation Potentials in the Model–Solid Theory," Physical Review B, vol. 39, No. 3, Jan. 15, 1989, pp. 1871–1883.

Doyeol Ahn, et al., "Optical Gain and Gain Suppression of Quantum–Well Lasers with Valence Band Mixing," IEEE Journal of Quantum Electronics, vol. 26, No. 1, Jan., 1990. pp. 13–24.

Yao Zou, et al., "Experimental Study of Auger Recombination, Gain, and Temperature Sensitivity of 1.5 μm Compressively Strained Semiconductor Lasers," IEEE Journal of Quantum Electronics. vol. 29, No. 6, Jun. 1993, pp. 1565–1575.

T. Namegaya, et al., "Effects of Well Number in 1.3 μm GaInAsP/InP GRIN–SCH Strained–Layer Quantum–Well Lasers," IEEE Journal of Quantum Electronics, vol. 30, No. 2, Feb., 1994, pp. 578–584.

E.R. Youngdale, et al., "Auger Lifetime Enhancement in InAs–Ga$_{1-x}$In$_x$Sb Superlattices," Appl. Phys. Lett., vol. 64, No. 23, Jun. 6, 1994, pp. 3160–3162.

(List continued on next page.)

Primary Examiner—Douglas Wille
(74) Attorney, Agent, or Firm—Foley & Lardner LLP

(57) ABSTRACT

Semiconductor optoelectronic devices such as diode lasers are formed on GaAs with an active region with a GaAsN electron quantum well layer and a GaAsSb hole quantum well layer which form a type II quantum well. The active region may be incorporated in various devices to provide light emission at relatively long wavelengths, including light emitting diodes, amplifiers, surface emitting lasers and edge-emitting lasers.

33 Claims, 12 Drawing Sheets

OTHER PUBLICATIONS

J.R. Meyer, t al., "Type–II Quantum–Well Lasers for the Mid–Wavelength Infrared," Appl. Phys. L tt., vol. 67, No. 6, Aug. 7, 1995, pp. 757–759.

Dubravko I, Babic, et al., "Room–Temperature Continuous–Wave Operation of 1.54 μm Vertical–Cavity Lasers," IEEE Photonics Technology Letters, vol. 7, No. 11, Nov., 1995, pp. 1225–1227.

J.I. Malin, et al., "Type II Mid–Infrared Quantum Well Lasers," App. Phys. Lett., vol. 68, No. 21, May 20, 1996, pp. 2976–2978.

D. Bimberg, et al., "InGaAs–GaAs Quantum–Dot Lasers," IEEE Journal of Selected Topics in Quantum Electronics, vol. 3, No. 2, Apr., 1997, pp. 196–205.

Masahiko Kondow, et al., "GaInNAs: A Novel Material for Long–Wavelength Semiconductor Lasers," IEEE Journal of Selected Topics in Quantum Electronics, vol. 3, No. 3, Jun., 1997, pp. 719–730.

Shunichi Sato, et al., "Metalorganic Chemical Vapor Deposition of GaInNAs Lattice Matched to GaAs for ILong–Wavelength Laser Diodes," Journal of Crystal Growth, vol. 192, Nos. ⅔, Sep., 1998, pp. 381–385.

T. Anan, et al., "GaAsSb: A Novel Material for 1.3 μm VCSELs," Electronics Letters, vol. 34, No. 22, Oct. 29, 1998, pp. 2127–2129.

D.L. Huffaker, et al., "1.3 μm Room–Temperature GaAs–Based Quantum–Dot Laser," Applied Physics Letters, vol. 73, No. 18, Nov. 2, 1998, pp. 2564–2565.

J.R. Meyer, et al., "Auger Coefficients in Type–II InAs/$Ga_{1-x}In_xSb$ Quantum Wells," Applied Physics Letters, vol. 73, No. 20, Nov. 16, 1998, pp. 2857–2859.

F. Hohnsdorf, et al., "Reduced Threshold Current Densities of (GaIn)(NAs)/GaAs Single Quantum Well Lasers for Emission Wavelengths in the Range 1.28–1.38 μm," Electronics Letters, vol. 35, No. 7, Apr. 1, 1999, pp. 571–572.

Pallab Bhattacharya, et al., "In(Ga)As/GaAs Self–Organized Quantum Dot Lasers: DC and Small–Signal Modulation Properties," IEEE Transactions on Electron Devices, vol. 46, No. 5, May, 1999, pp. 871–883.

D. Kwon, et al., "Deep Levels in P–Type InGaAsN Lattice Matched to GaAs," Applied Physics Letters, vol. 74, No. 19, May 10, 1999, pp. 2830–2832.

Alistair F. Phillips, et al., "The Temperature Dependence of 1.3– and 1.5–μm Compressively Strained InGaAs(P) MQW Semiconductor Lasers," IEEE Journal of Selected Topics in Quantum Electronics, vol. 5, No. 3, May/Jun., 1999, pp. 401–412.

Shunichi Sato, et al., "Room–Temperature Continuous––Wave Operation of 1.24–μm GaInNAs Lasers Grown by Metal–Organic Chemical Vapor Deposition," IEEE Journal of Selected Topics In Quantum Electronics, vol. 5, No. 3, May/Jun., 1999, pp. 707–710.

J. Boucart, et al., "1–mW CW–RT Monolithic VCSEL at 1.55 μm," IEEE Photonics Technology Letters, vol. 11, No. 6, Jun., 1999, pp. 629–631.

F. Koyama, et al., "1.2 μm Highly Strained GaInAs/GaAs Quantum Well Lasers for Singlemode Fibre Datalink," Electronics Lett rs, vol. 35, No. 13, Jun. 24, 1999, pp. 1079–1081.

D. Schlenker, et al., "1.17–μm Highly Strained GaInAs–GaAs Quantum–Well Laser," IEEE Ph tonics Technology Letters, vol. 11, No. 8, Aug., 1999, pp. 946–948.

P. Dowd, et al., "Long Wavelength (1.3 and 1.5 μm) Photoluminescense fromInGaAs/GaPAsSb Quantum Wells Grown on GaAs," Applied Physics Letters, vol. 75, No. 9, Aug. 30, 1999, pp. 1267–1269.

Shunichi Sato, et al., "1.21 μm Continuous–Wave Operation of Highly Strained GaInAs Quantum Well Lasers on GaAs Substrates," Japanese J. of Appl. Phys., vol. 38, No. 9, Sep. 15, 1999, pp. 990–992.

Kohki Mukai, et al., "1.3–μm CW Lasing of InGaAs–GaAs Quantum Dots at Room Temperature with a Threshold Current of 8 mA," IEEE Photonics Technology Letters, vol. 11, No. 10, Oct., 1999, pp. 1205–1207.

E.P. O'Reilly, et al., "k–P Model of Ordered $GaN_xAs_{1-x}$," Physica Status Solidi (b), vol. 216, No. 1, Nov. 1, 1999, pp. 131–134.

Won–Jin Choi, et al., "1.2–μm GaAsP/InGaAs Strain Compensated Single–Quantum–Well Diode Laser on GaAs Using Metal–Organic Chemical Vapor Deposition," IEEE Photonics Technology Letters, vol. 11, No. 12, Dec., 1999, pp. 1572–1574.

M.R. Gokhale, et al., "Low–Threshold Current, High–Efficiency 1.3–μm Wavelength Aluminum–Free InGaAsN–Based Quantum–Well Lasers," IEEE Photonics Technology Letters, vol. 12, No. 2, Feb., 2000, pp. 131–133.

C.W. Coldren, et al., "1200 nm GaAs–Based Vertical Cavity Lasers Employing GaInNAs Multiquantum Well Active Regions," Electronics Letters, vol. 36, No. 11, May 25, 2000, pp. 951–952.

K.D. Choquette, et al., "Room Temperature Continuous Wave InGaAsN Quantum Well Vertical–Cavity Lasers Emitting at 1.3 μm," Electronics Letters, vol. 36, No. 16, Aug. 3, 2000, pp. 1388–1390.

Pallab Bhattacharya, et al., "High–Speed Modulation and Switching Characteristics of In(Ga)As–Al(Ga)As Self–Organized Quantum–Dot Lasers," IEEE Journal of Selected Topics in Quantum Electronics, vol. 6, No. 3, May/Jun. 2000, pp. 426–438.

A. Stintz, et al., "Low–Threshold Current Density 1.3–μm InAs Quantum–Dot Lasers with the Dots–in–a–Well (DWELL) Structure," IEEE Photonics Technology Letters, vol. 12, No. 6, Jun., 2000, pp. 591–593.

B. Borchert, et al., "Static and Dynamic Characteristics of 1.29–μm GaInNAs Ridge–Waveguide Laser Diodes," IEEE Photonics Technology Letters, vol. 12, No. 6, Jun., 2000, pp. 597–599.

Olga Blum, et al., "Characteristics of GaAsSb Single–Quantum–Well–Lasers Emitting at 1.3 μm," IEEE Photonics Technology Letters, vol. 12, No. 7, Jul., 2000, pp. 771–773.

Mitsuki Yamada, t al., "Low–Threshold Operation of 1.3–μm GaAsSb Quantum–Well Lasers Directly Grown on GaAs Substrates," IEEE Photonics Technology Letters, vol. 12, No. 7, Jul., 2000, pp. 774–776.

Chaing–Wan Ryu, et al., "Low Threshold Current Density GaAsSb Quantum Well (QW) Lasers Grown by Metal Organic Chemical Vapour Deposition on GaAs Substrates," Electronics Letters, V I. 36, No. 16, Aug. 3, 2000, pp. 1387–1388.

E. Hall, et al., "Room–Temperature, CW Operation of Lattice–Matched Long–Wavelength VCSELs," Electronics Letters, vol. 36, No. 17, Aug. 17, 2000, pp. 1485–1487.

W. Braun, et al., "Strained InGaAs/GaPAsSb Heterostructures Grown on GaAs (001) for Optoelectronic Applications in the 1100–1550 nm Range,"Journal of Applied Physics, vol. 88, No. 5, Sep. 1, 2000, pp. 3004–3014.

Guobin Liu, et al., "Optical Gain of Strained GaAsSb/GaAs Quantum–Well Lasers: A Self–Consistent Approach," Journal of Applied Physics, vol. 88, No. 10, Nov. 15, 2000, pp. 5554–5561.

James S. Harris, Jr., "Tunable Long–Wavelength Vertical–Cavity Lasers: The Engine of Next Generation Optical Networks?" IEEE Journal on Selected Topics In Quantum Electronics, vol. 6, No. 6, Nov./Dec. 2000, pp. 1145–1160.

F. Quochi, et al., "Room Temperature Operation of GaAsSb/GaAs Quantum Well VCSELs at 1.29 $\mu$m," Electronics Letters, vol. 36, No. 25, Dec. 7, 2000, pp. 2075–2076.

R. Fehse, et al., "Insights Into Carrier Recombination Processes in 1.3 $\mu$m GaInNAs–Based Semiconductor Lasers Attained Using High Pressure," Electronics Letters, vol. 37, No. 2, Jan. 18, 2001, pp. 92–93.

S.R. Kurtz, et al., "MOCVD–Grown, 1.3 $\mu$m InGaAsN Multiple Quantum Well Lasers Incorporating GaAsP Strain–Compensation Layers," Proceedings of SPIE, vol. 4287, 2001, pp. 170–175.

J. Wu, et al., "Effect of Band Anticrossing on the Optical Transitions in $GaAs_{1-x}N_x$/GaAs Multiple Quantum Wells," Physical Review B, vol. 64, 2001, pp. 1–4.

Nelson Tansu, et al., "High–Performance Strain–Compensated InGaAs–GaAsP–GaAs ($\lambda$=1.17 $\mu$m) Quantum–Well Diode Lasers," IEEE Photonics Technology Letters, vol. 13, No. 3, Mar., 2001, pp. 179–181.

Marc O. Fischer, et al., "Room–Temperature Operation of GaInAsN–GaAs Laser Diodes in the 1.5–$\mu$m Range," IEEE Journal on Selected Topics in Quantum Electronics, vol. 7, No. 2, Mar./Apr. 2001, pp. 149–151.

T. Anan, et al., "Continuous–Wave Operation of 1.30 $\mu$m GaAsSb/GaAs VCSELs," Electronics Letters, vol. 37, No. 9, Apr. 26, 2001, pp. 566–567.

Masao Kawaguchi, et al., "Lasing Characteristics of Low–Threshold GaInNAs Lasers Grown by M talorganic Chemical Vapor Deposition," Japanese J. App. Phys., vol. 40, 2001, pp. 744–746.

Wang W. Chow, et al., "Contributions to the Large Blue Emission Shift in a GaAsSb Type–II Laser," IEEE Journal of Quantum Electronics, vol. 37, No. 9, Sep., 2001, pp. 1178–1182.

S. Tomic, t al., "A Theoretical Analysis of the Radiative Current and its Dependence on Pressure in GaInNAs 1.3 $\mu$m Lasers," IEEE LEOS 2001, San Diego, CA, Nov., 2001, pp. 328–329.

Wonill Ha, et al., "High Efficiency Multiple Quantum Well GaInNAs/GaNAs Ridge–Waveguide Diode Lasers," Proceedings of SPIE vol. 4651, 2002, pp. 42–48.

Nelson Tansu, et al., "Low–Threshold Strain–Compensated InGaAs(N) ($\lambda$=1.19–1.31 $\mu$m) Quantum–Well Lasers," IEEE Photonics Technology Letters, vol. 14, No. 4, Apr., 2002, pp. 444–446.

Nelson Tansu, et al., "Temperature Analysis and Characteristics of Highly Strained InGaAs–GaAsP–GaAs ($\lambda$>1.17 $\mu$m) Quantum–Well Lasers," IEEE Transactions on Quantum Electronics, vol. 38, No. 6, Jun. 2002, pp. 640–651.

* cited by examiner

TYPE II QUANTUM WELL OPTOELECTRONIC DEVICES

STATEMENT OF GOVERNMENT RIGHTS

This invention was made with United States Government support awarded by the following agency: NSF 9734283. The United States has certain rights in this invention.

FIELD OF THE INVENTION

The present invention relates generally to the field of optoelectronic devices such as light emitting diodes and semiconductor diode lasers and more specifically to the field of type II quantum well devices.

BACKGROUND OF THE INVENTION

Fiber optic transmission of data signals across large distances is presently accomplished using a variety of laser transmitters, which are generally designed to operate in three primary wavelengths, e.g., 850 nanometers, 1.3 $\mu$m, and 1.55 $\mu$m. For a predetermined bandwidth, increasing the wavelength of light emitted from a laser transmitter acts to increase the distance that data and information may travel without requiring amplification. For example, in a system having a 10 gigabyte per second bandwidth, use of an 850 nanometer wavelength transmitter allows signals to be transmitted between approximately 50 to 100 meters without amplification, while the use of a transmitter in the 1.55 $\mu$m regime allows transmission of signals up to approximately 2000 kilometers without amplification. Amplification of these signals (e.g., using an erbium amplifier) allows propagation of such signals even greater distances.

Long-haul fiber optic transmissions currently utilize 1.55 micrometer distributed feedback (DFB) edge emitting lasers as transmitters. Such DFB lasers are relatively expensive, and vertical cavity surface emitting lasers (VCSELs) potentially offer a lower-cost alternative to DFB edge emitting lasers.

A number of issues are presented by previous attempts to produce relatively low cost, manufacturable VCSEL lasers having emission wavelengths in the 1.55 $\mu$m. For example, InP-based 1.5 micrometer VCSELs conventionally use wafer-bonding distributed Bragg reflectors (DBRs), metamorphic DBRs, or Sb-based DBRs. Such VCSELs require relatively sophisticated and challenging fabrication processes. Lasing performance of such VCSELs is also generally inferior to InP-based edge-emitting lasers.

Conventional active regions for 1.55 $\mu$m lasers (e.g., edge-emitting lasers for use as laser pumps for Raman fiber amplifiers) are based on InGaAs or InGaAsP multiple quantum wells (MQWs) on InP substrates. Such lasers are inherently temperature-sensitive, which may not be suitable for a number of applications. It is believed that the temperature sensitivity results from several factors, including Auger recombination, carrier leakage processes, intervalence band absorption (IVBA), and temperature dependency of the material gain.

Difficulties in forming high quality DBRs on InP substrates and the temperature sensitivity of resulting activation regions has led to research in extending emission wavelengths on GaAs substrates (e.g., using highly-strained InGaAsN(Sb) quantum wells (QWs) and InGaAs—GaAsSb type II QWs. This research has not produced high-performance laser operation at 1.55 $\mu$m.

Thus, it would be advantageous to be able to provide a laser that exhibits high performance laser operation in the 1.55 $\mu$m regime using a GaAs substrate, and which may be produced relatively simply and inexpensively in comparison with conventional 1.55 $\mu$m lasers. It would be particularly advantageous to provide these characteristics in a VCSEL laser.

SUMMARY OF THE INVENTION

In accordance with the present invention, GaAs based optoelectronic devices have an active region that includes electron quantum well layers of GaAsN or InGaAsN and a hole layer quantum well of GaAsSb with a type II structure. The GaAsN or InGaAsN electron quantum well layer is preferably in tensile strain and the GaAsSb hole quantum well layer is preferably in compressive strain to provide light generation at desired wavelengths. Light can be generated at relatively long wavelengths, e.g., 1.3 $\mu$m or higher. A GaAs barrier layer is preferably formed adjacent to the GaAsN or InGaAsN layer.

In the devices of the invention, a multilayer semiconductor structure incorporating this active region layer is preferably epitaxially deposited on a substrate of GaAs. The thicknesses of the quantum well layers may each preferably be at least about 20 Å and less than about 50 Å. The quantum well layers can be selected to provide light emission at relatively long wavelengths, e.g., in the range of 1.3 $\mu$m to 3.0 $\mu$m.

The device preferably includes multiple quantum wells. Such a multiple-stage quantum well device includes a substrate comprising GaAs and a GaAs barrier layer, and multiple quantum well stages each of which includes GaAsN or InGaAsN electron quantum well layers and a GaAsSb hole quantum layer, each having appropriate strain for the desired wavelength of light emission.

The present invention may be embodied in various types of optoelectronic devices including amplifiers, light emitting diodes, and edge emitting and surface emitting lasers which incorporate optical feedback to provide lasing action.

Further objects, features and advantages of the invention will be apparent from the following detailed description when taken in conjunction with the accompanying drawings.

DETAILED DESCRIPTION OF THE INVENTION

Figure 1:
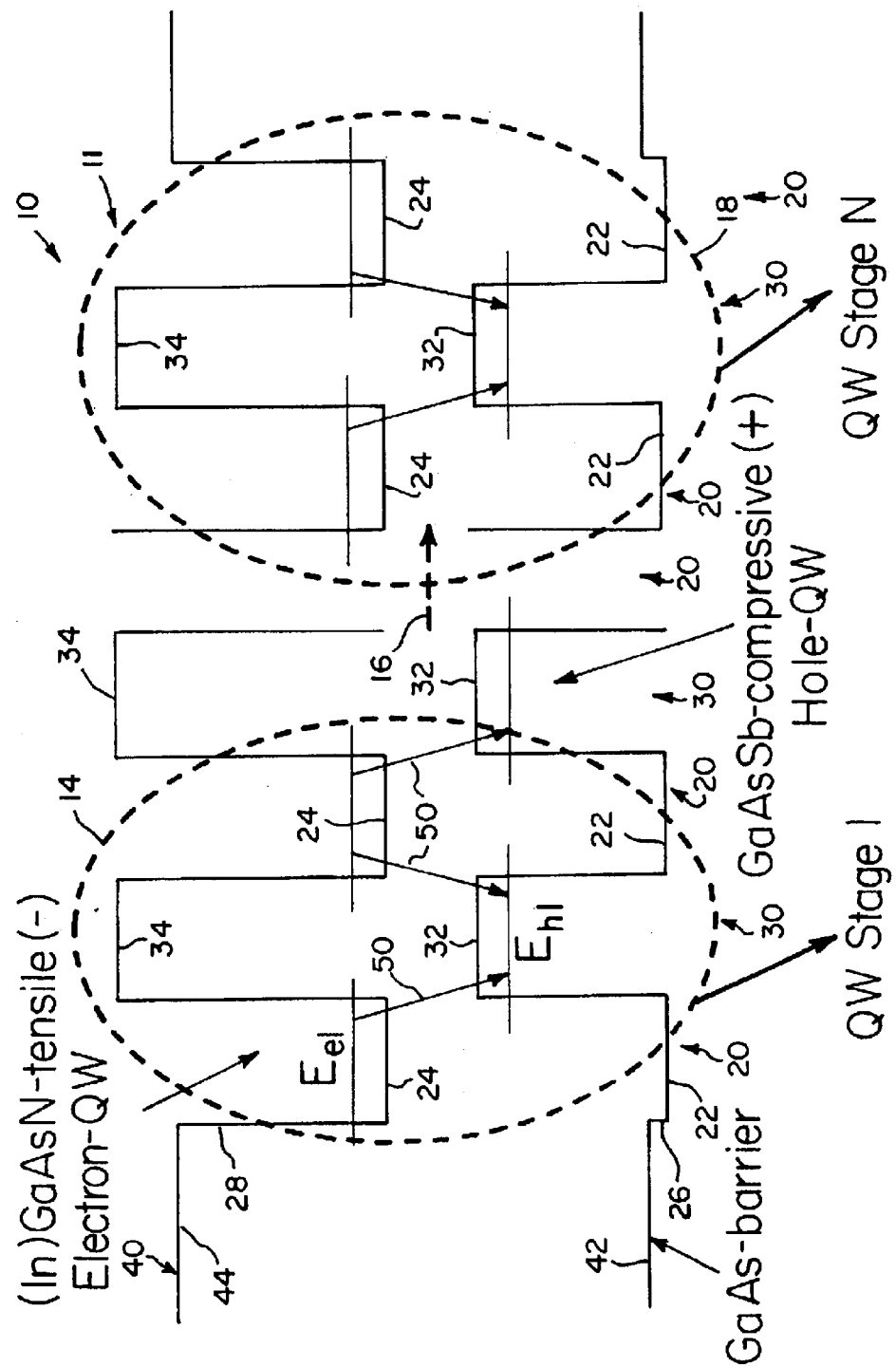
FIG. 1 is a schematic energy band diagram for a multiple-stage type II quantum well device in accordance with the invention.

With reference to the drawings, FIG. 1 shows a schematic energy band diagram 10 for a multiple quantum well (MQW) GaAs—GaAsN—GaAsSb active region which may be incorporated in an optoelectronic device in accordance with the invention. A GaAs barrier layer 40 is provided adjacent to a first quantum well stage 14 that includes an electron quantum well (QW) 20 of tensile strained GaAsN and a hole QW 30 of compressive strained GaAsSb. The electron quantum well layers 20 may also include indium to provide an InGaAsN layer 20 as indicated in FIG. 1. The addition of indium allows adjustment of the lattice constant of the InGaAsN material to be either lattice matched to GaAs or have a tensile strain value which is lower than GaAsN. This allows independent control of layer thickness and strain, giving greater design flexibility. Previous approaches to type II GW laser structures on GaAs substrates have utilized a compressively-strained InGaAs electron quantum well layer. See P. Dowd, et al., "Long Wavelength (1.3 and 1.5 $\mu$m) Photoluminescence from InGaAs/GaPAsSb Quantum Wells Grown on GaAs," Appl. Phys. Lett., Vol. 75, No. 9, Aug. 30, 1999, pp. 1267–1269. The GaAs barrier layer 40 has a valence band shown at 42 and a conduction band shown at 44.

Other higher bandgap materials may be used as the barrier layer, e.g., AlGaAs, GaAsP, and InGaP. The electron QW 20 has a valence band shown at 22 and a conduction band shown at 24, and the hole QW 30 has a valence band shown at 32 and a conduction band shown at 34. The conduction band 24 of the electron well 20 is provided by the GaAsN layer, while the valence band 32 of the hole-well 30 is provided by the GaAsSb layer. One or more additional stages of similar material layers may be provided adjacent to the first stage 14 to form a multiple QW stage laser. FIG. 1 shows a break 16 and a QW stage "N" 18, to indicate that any number of QW stages may be provided in various exemplary embodiments. The one or more stages provided above the GaAs barrier layer 40 may collectively be referred to as an active region 11.

As shown in FIG. 1, the conduction and valence bands of the electron QW 20 and the hole QW 30 are arranged in an offset or "zig-zag" pattern. As illustrated in FIG. 1, the electron and hole quantum wells have a type II interface in which the lowest electron energy level and the lowest hole energy level occur in adjacent layers. By contrast, in a type I quantum well the lowest electron and hole energy levels are in the same layer. During operation, in the active region 11 electrons travel between the conduction band 24 of the electron QW 20 and the valence band 32 of the hole QW 30, recombining with holes and generating photons in the process. The transition is generally indicated by arrows 50. The zig-zag pattern is a result of the large disparity of the band lineup of the GaAsN and GaAsSb compositions (i.e., the compositions used to form the electron QW 20 and the hole QW 30) with that of the GaAs barrier layer 40. GaAsN has a weak type-II band lineup with a negative valence band offset ($\Delta E_v$) of approximately 20 meV/% N, which is shown in FIG. 1 at 26. The GaAs—GaAsN interface also exhibits a large conduction band offset ($\Delta E_c$), shown at 28. The band edge of the hole QW 30 may be determined using the model solid theory. As shown in FIG. 1, there is a relatively small $\Delta E_c$ between the GaAs conduction band 44 and the hole QW conduction band 34 and a relatively large $\Delta E_v$ between the GaAs valence band 42 and the hole QW valence band 32.

One advantageous feature of using GaAsN and GaAsSb to form the active region 11 is that tensile-strained GaAsN and compressively-strained GaAsSb may exhibit self-strain-compensation. Such self-strain-compensation allows for the growth of any number of multiple QW structures, which in turn allows optimization of the optical gain in the resulting laser device.

Another advantageous feature associated with the GaAsN—GaAsSb active region 11 is strong carrier confinement, both for the electrons and holes in their respective QWs. For example, the electrons are confined in the electron QW 20 as a result of the relatively large $\Delta E_c$ between GaAsN and both GaAs and GaAsSb (or, where the GaAsN is surrounded between two adjacent GaAsSb regions, the relatively large $\Delta E_c$ between GaAsN and GaAsSb). In effect, the electrons in the electron QW 20 are "sandwiched" between the GaAs conduction band 44 and the GaAsSb conduction band 34. Similarly, the holes in the hole QWs are confined by the relatively large $\Delta E_v$ between GaAsSb and GaAsN. Strong carrier confinement in the GaAsN—GaAsSb active region may allow for low device temperature sensitivity and high-output-power laser operation.

Yet another advantageous feature of using alternating layers of tensile-strained GaAsN and compressive-strained GaAsSb relates to overlap of electron wavefunctions. Conventionally, the electron wavefunctions are spread out strongly due to large differences in the electron effective masses of the GaAsSb and GaAsN layers. The use of tensile-strained GaAsN and compressive-strained GaAsSb results in the spreading of the hole wavefunction in the hole QW valence band 32. This may allow higher optical gain in the laser due to large electron-hole wavefunction overlap.

Figure 2:
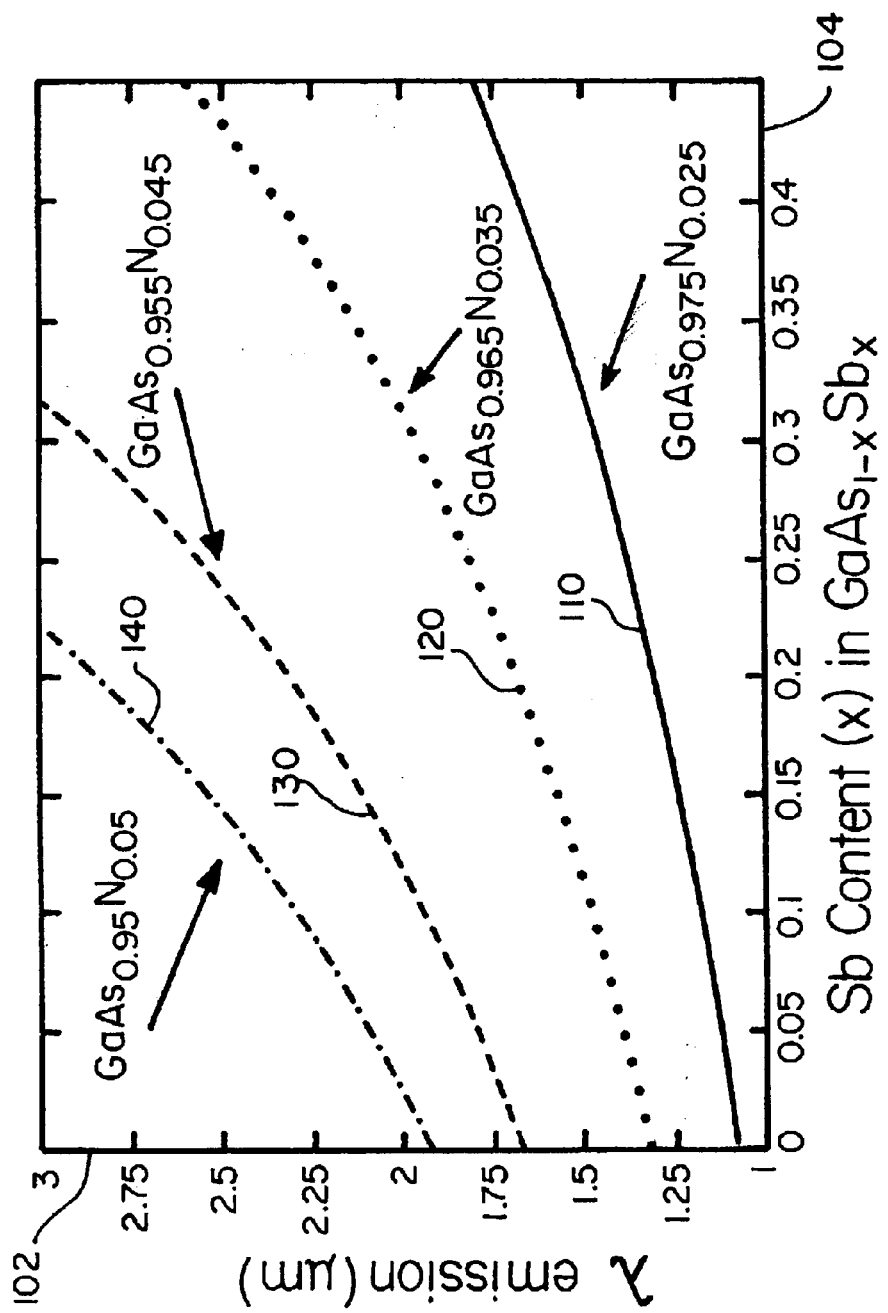
FIG. 2 is a graph showing the calculated emission wavelength of a GaAsN—GaAsSb—GaAs type II quantum well with 40 Å individual well thicknesses for various Sb and N content, with strain effect and maximum quantum confinement effect.

The use of GaAsN/GaAsSb quantum well active regions can allow emission of light having relatively long wavelengths. FIG. 2 shows the calculated relationship between emission wavelength ($\lambda$) and nitrogen and antimony content for a GaAsN—GaAsSb active region wherein the GaAsN and GaAsSb quantum well layers each had thicknesses of approximately 40 angstroms (Å). The ordinate or y-axis 102 corresponds to the emission wavelength measured in micrometers ($\mu$m). The emission wavelength was calculated based on calculated transitional energy levels including strain effects and the maximum quantum confinement effect (to illustrate the worst case scenario). The abscissa or x-axis 104 corresponds to antimony (Sb) content x in a GaAsSb layer having the formula $GaAs_{1-x}Sb_x$. The curves labeled 110, 120, 130, and 140 represent the relationship between emission wavelength and antimony content (in the $GaAs_{1-x}Sb_x$ layer) for active regions having GaAsN layers with formulae $GaAs_{0.975}N_{0.025}$, $GaAs_{0.965}N_{0.035}$, $GaAs_{0.955}N_{0.045}$, and $GaAs_{0.95}N_{0.05}$, respectively.

As shown in FIG. 2, the emission wavelength generally increases with increasing antimony content in the GaAsSb layer, as indicated by the positive slopes of the curves 110, 120, 130, and 140. The emission wavelength also increases with increasing nitrogen content, as shown by the relationship between the curves 110, 120, 130, and 140. Higher nitrogen and antimony contents in the GaAsN or GaAsSb layers results in a smaller transition energy. Higher nitrogen content in the GaAsN layers lowers the electron confined energy level, while larger antimony content in the GaAsSb layer results in a higher confined hole energy level.

In this manner, emission wavelengths of active regions having a particular configuration may be generally predicted. As shown in FIG. 2, the design utilizing $GaAs_{0.965}N_{0.035}$ and $GaAs_{0.969}Sb_{0.031}$ results in an emission wavelength of approximately 2 $\mu$m. The extension of the emission wavelength into the 3–4 $\mu$m wavelength region is facilitated by the strain-compensating effect of the GaAsN—GaAsSb structure. For example, structures utilizing $GaAs_{0.955}N_{0.045}$ and $GaAs_{0.969}Sb_{0.031}$ layers result in emission wavelengths up to approximately 3 $\mu$m. It is believed that electron and hole confinement in the QWs improves with increasing emission wavelength due to the increased $\Delta E_c$ and $\Delta E_v$ for structures having higher nitrogen and antimony content.

According to an exemplary embodiment, a GaAsN—GaAsSb active region is configured to produce emission wavelengths of approximately 1.55 $\mu$m (e.g., with GaAsN and GaAsSb layer thicknesses of between approximately 25 and 35 Å). The active region includes GaAsN electron QWs having molar ratios of between approximately 1:0.0985:0.015 and 1:0.975:0.025 (i.e., between approximately $GaAs_{0.985}N_{0.015}$ and $GaAs_{0.975}N_{0.025}$, that is the molar nitrogen content is between approximately 1.5 and 2.5 percent). The active region also includes GaAsSb hole QWs having a molar ratio between approximately 1:0.7:0.3 and 1:0.6:0.4. The antimony content of the GaAsSb layer results in a compressive strain of between approximately 2.3 and 3.0 percent. Such a configuration may reduce or eliminate the occurrence of strain relaxation in the GaAsN—GaAsSb structure due to the thin dimension of the GaAsSb hole QWs and the strain compensating effect of the GaAsN electron QWs.

Compositions (e.g., nitrogen and antimony content) of the GaAsN and GaAsSb QWs to obtain an active region that generates light in the range of 1.55 $\mu$m may be determined by calculating transitional energy, taking into account strain and quantum confinement effects. A propagation matrix approach for multilayer heterostructures may be used to determine the quantum-confined energy levels, which allows calculation of normalized wavefunctions for the electrons and holes present in the active region.

Figure 3:
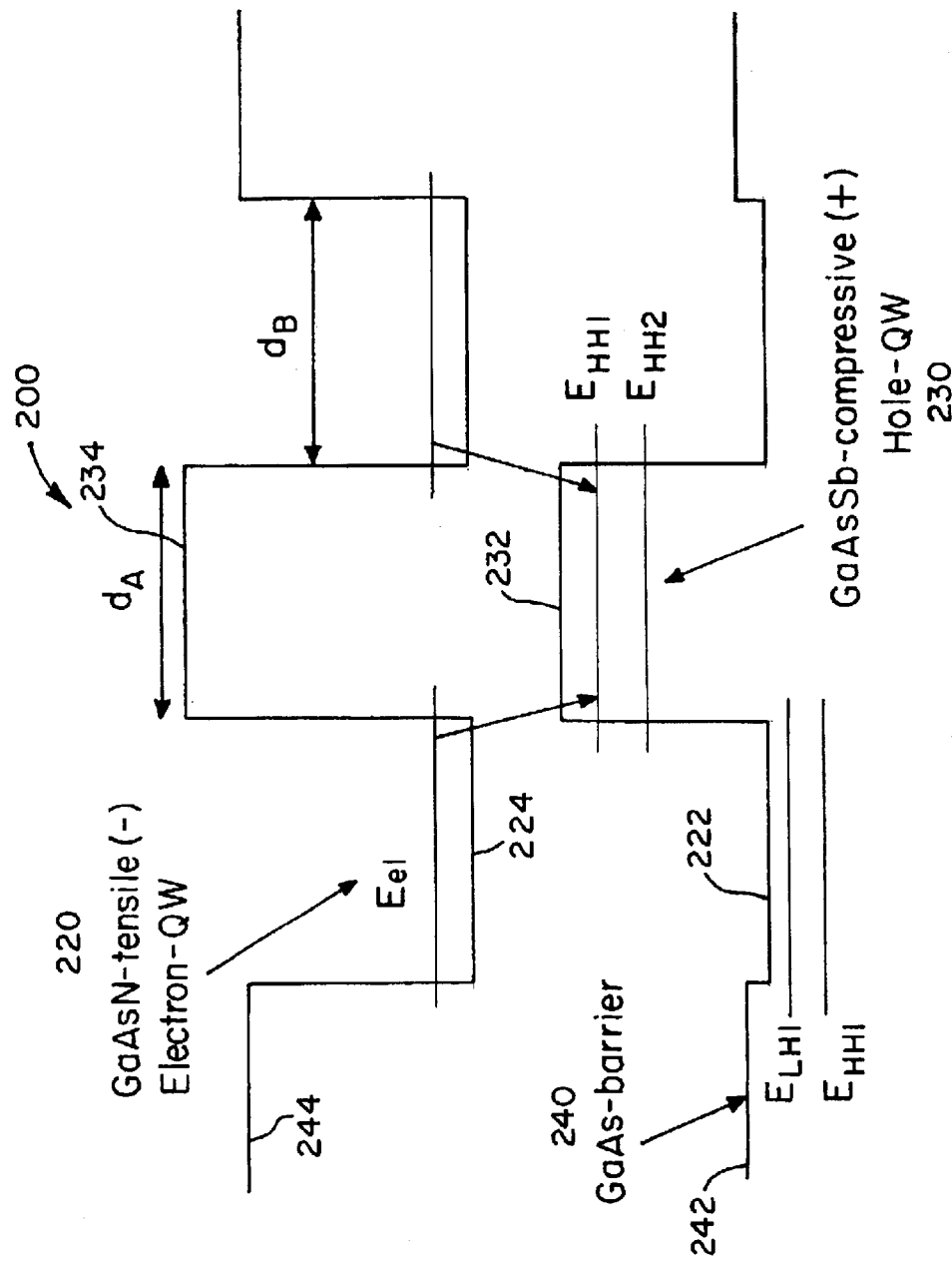
FIG. 3 is a schematic energy band diagram for a single-stage type II quantum well device showing the respective hole energy band edge for GaAsN and GaAsSb.

FIG. 3 shows an energy band diagram for a single-stage active region 200 that may be used to determine appropriate nitrogen and antimony contents for the electron and hole QWs. This energy band diagram illustrates the zig-zag pattern as described above with respect to FIG. 1. A GaAs barrier 240 has a valence band 242 and a conduction band 244. A tensile-strained GaAsN electron QW 220 has a valence band 222 and a conduction band 224, and a compressive-strained GaAsSb hole QW 230 has a valence band 232 and a conduction band 234. A single-stage active region may be used to approximate the emission wavelength of systems having a greater number of stages, since coupling of wave functions in multiple-stage active regions does not greatly modify the emission wavelength obtained by such multiple-stage active regions.

Figure 4:
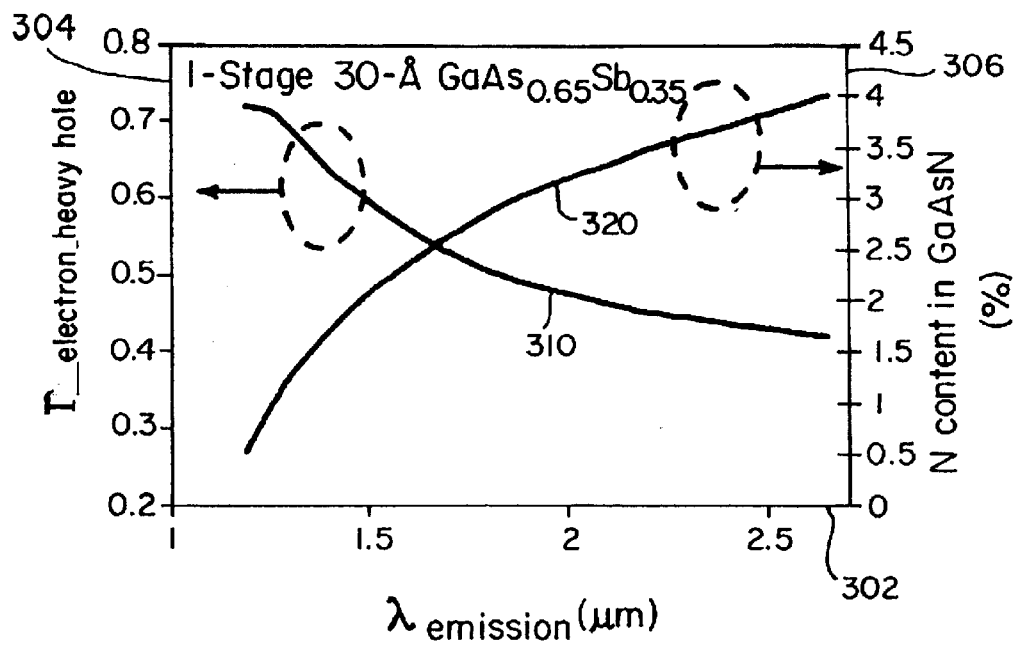
FIG. 4 are graphs showing the relationship between wavefunctions overlap and emission wavelength for an exemplary single-stage 30 Å/30 Å/30 Å GaAsN/GaAs$_{0.05}$Sb$_{0.35}$/GaAsN quantum well device and the relationship between nitrogen content in the GaAsN layers and the emission wavelength.

FIG. 4 illustrates the relationship between wavefunction overlap and emission wavelength for a single-stage QW active region (as in FIG. 3) having a GaAsSb hole QW composition of $GaAs_{0.65}Sb_{0.35}$. FIG. 4 also shows the relationship between nitrogen content in the GaAsN layer and emission wavelength. For this exemplary embodiment, the electron and hole QW layers each have a thickness of approximately 30 Å. It is understood that this is an example for illustrative purposes and other thicknesses may be used for the QW layers. The abscissa 302 represents emission wavelength in $\mu$m. A first ordinate 304 represents the degree of electron and hole wavefunctions overlap $\Gamma_{e-hh}$ (e.g., 0.6=60 percent overlap). A second ordinate 306 represents the nitrogen content of the GaAsN layer in molar percent (e.g., 2.5=$GaAs_{0.975}N_{0.025}$).

A first curve 310 in FIG. 4 represents the relationship between $\Gamma_{e-hh}$ and emission wavelength, and a second curve 320 represents the relationship between nitrogen content in the GaAsN layer and emission wavelength. As shown in FIG. 4, the degree of wavefunction overlap generally decreases with increasing emission wavelength, while emission wavelength generally increases with increased nitrogen content in the GaAsN layer.

While the wavefunction overlap tends to decrease as the emission wavelength is extended in a single-stage QW system, a wavefunction overlap of approximately 60 percent may be achieved at an emission wavelength of approximately 1.5 $\mu$m. According to an alternative embodiment in which a QW active region having a wavelength of 1.3 $\mu$m is provided, a wavefunction overlap of approximately 70 percent may be achieved. Wavefunction overlaps greater than approximately 45 percent are also predicted for emission wavelengths above 2 $\mu$m. Optimization of the nitrogen and antimony content for the GaAsN and GaAsSb layers is described below for a QW system having an emission wavelength of approximately 1.55 $\mu$m according to a preferred embodiment. It should be understood that for alternative embodiments having differing emission wavelengths (e.g., 1.3 $\mu$m or other wavelengths greater or less than 1.55 $\mu$m), similar optimization schemes may be employed.

Figure 5:
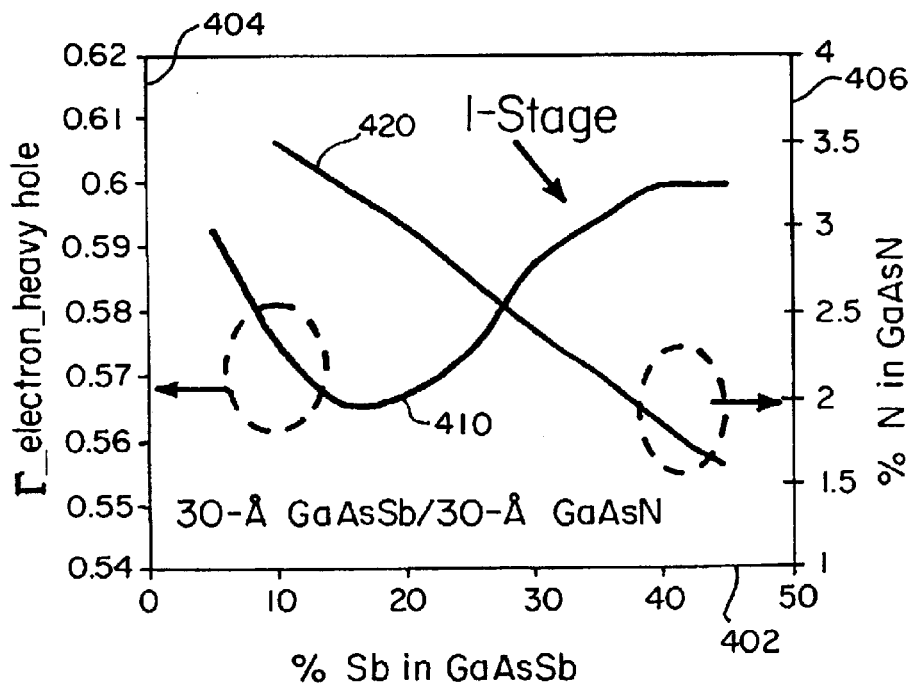
FIG. 5 are graphs showing the relationship between nitrogen and antimony content in the GaAsN and GaAsSb layers of a single-stage quantum well device to achieve an emission wavelength of approximately 1.55 $\mu$m and the relationship between wavefunctions overlap and antimony content in the GaAsSb layer.

FIG. 5 illustrates by the graph 420 the relationship between nitrogen and antimony content for GaAsN and GaAsSb layers of a single-stage QW system to achieve an emission wavelength of approximately 1.55 $\mu$m. The GaAsN and GaAsSb layers have a thickness of approximately 30 Å. FIG. 5 also shows by the graph 410 the relationship between wavefunction overlap and antimony composition in the GaAsSb layer. The abscissa 402 represents the antimony content of the GaAsSb layer in molar percent (e.g., 30=$GaAs_{0.7}Sb_{0.3}$). A first ordinate 304 represents the degree of electron and hole wavefunctions overlap $\Gamma_{e-hh}$ (e.g., 0.6=60 percent overlap). A second ordinate 306 represents the nitrogen content of the GaAsN layer in molar percent (e.g., 2.5=$GaAs_{0.975}N_{0.025}$).

As shown in FIG. 5, various compositions of the 30 Å thick GaAsSb and 30 Å thick GaAsN QWs can be chosen to achieve an emission wavelength of approximately 1.55 μm. Nitrogen content in the GaAsN layer must generally be increased to compensate for a decreased antimony content in the GaAsSb layer to achieve an emission wavelength of approximately 1.55 μm. A GaAsSb composition having a large antimony content allows the use of a GaAsN composition having a reduced nitrogen content. One advantageous feature of providing a GaAsN QW having a reduced nitrogen content is that higher optical luminescence of the GaAsN QW may be achieved. The nitrogen content in the GaAsN layer, however, is preferably large enough to provide relatively strong electron confinement in the GaAsN electron QWs.

Figure 6:
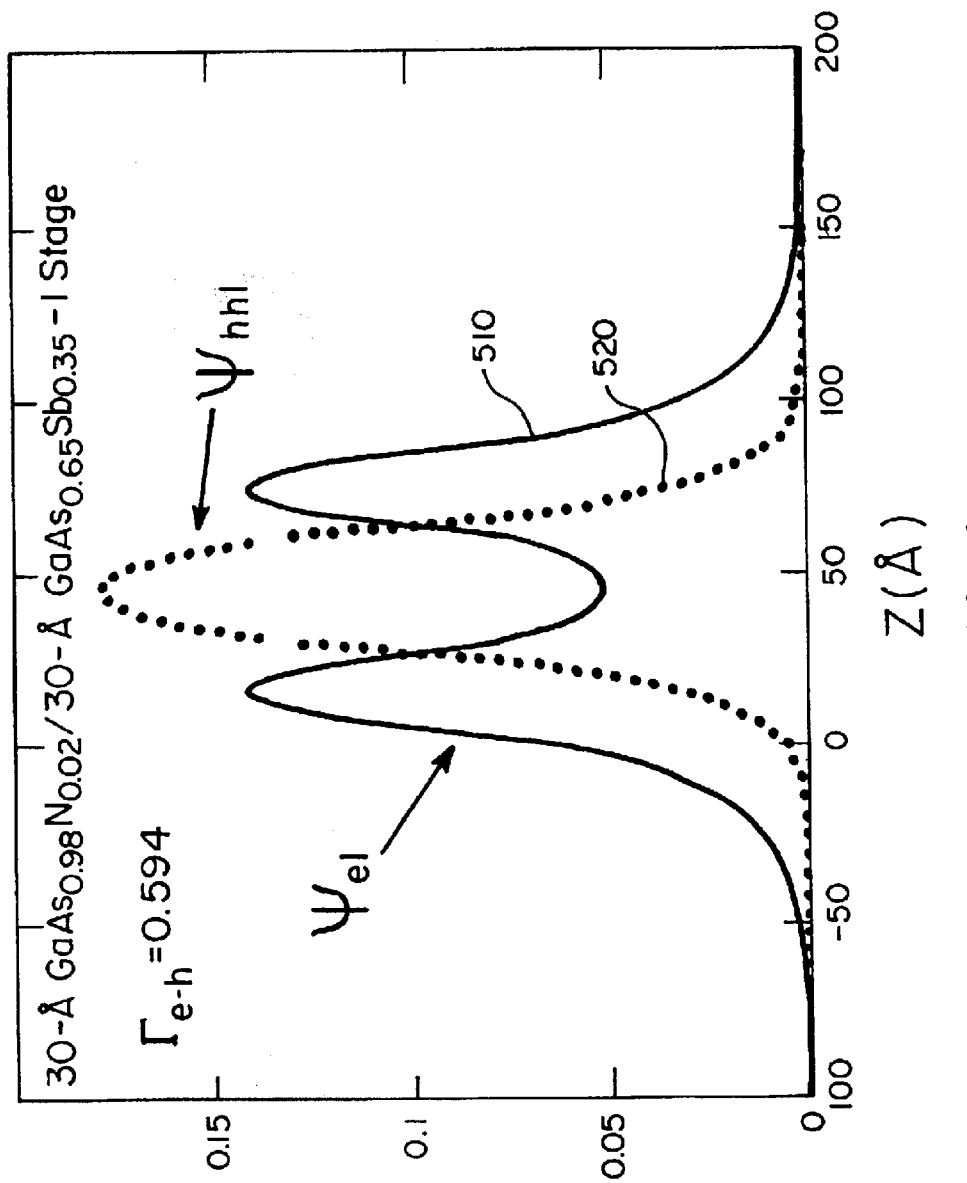
FIG. 6 are graphs showing the wavefunctions overlap for electron and heavy-hole wavefunctions of a single-stage quantum well device.

FIG. 6 illustrates the wavefunctions overlap for electron ($\Psi_{el}$) and heavy-hole ($\Psi_{hh}$) wavefunctions in a single-stage active region having an approximately 30 Å thick layer of $GaAs_{0.98}N_{0.02}$ and an approximately 30 Å thick layer of $GaAs_{0.65}Sb_{0.35}$. A first curve 510 represents the electron wavefunction, and a second curve 520 represents the heavy-hole wavefunction. The heavy-hole wavefunction is used because transitions of electrons to heavy hole levels are favored due to the compressive strain of the GaAsSb hole QW. As shown in FIG. 6, a wavefunctions overlap of approximately 59.4 percent is obtained for a single-stage active region having the composition described above.

Figure 7:
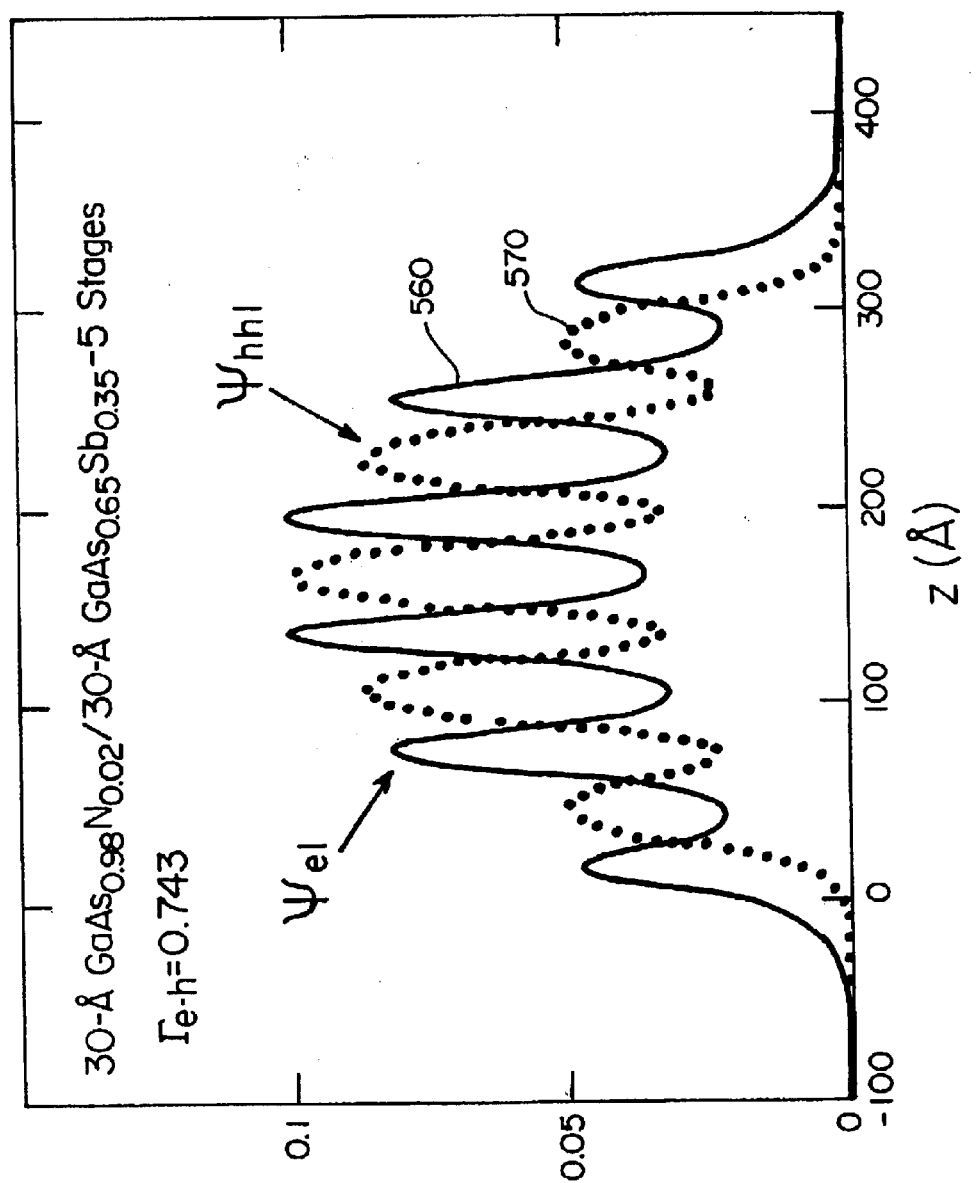
FIG. 7 are graphs showing the wavefunctions overlap for electron and heavy-hole wavefunctions of a 5-stage quantum well device.

Wavefunction overlap in a MQW design may be increased by providing strong coupling for the electron wavefunction, which provides a large field in the GaAsSb region for the electron- and hole-wavefunctions. According to an exemplary embodiment, relatively strong coupling of the QWs may be achieved by reducing the size of the QWs. According to a preferred embodiment, relatively strong coupling is achieved by implementing a MQW system design. Such multiple-QW system design includes QWs having thicknesses that are preferably above approximately 30 Å to provide strong carrier confinement and good control in the MOCVD growth processes. FIG. 7 illustrates an MQW design (i.e., 5 stage) that has a wavefunction overlap of approximately 74.3 percent between an electron wavefunction curve 560 and a heavy-hole wavefunction curve 570.

Figure 8:
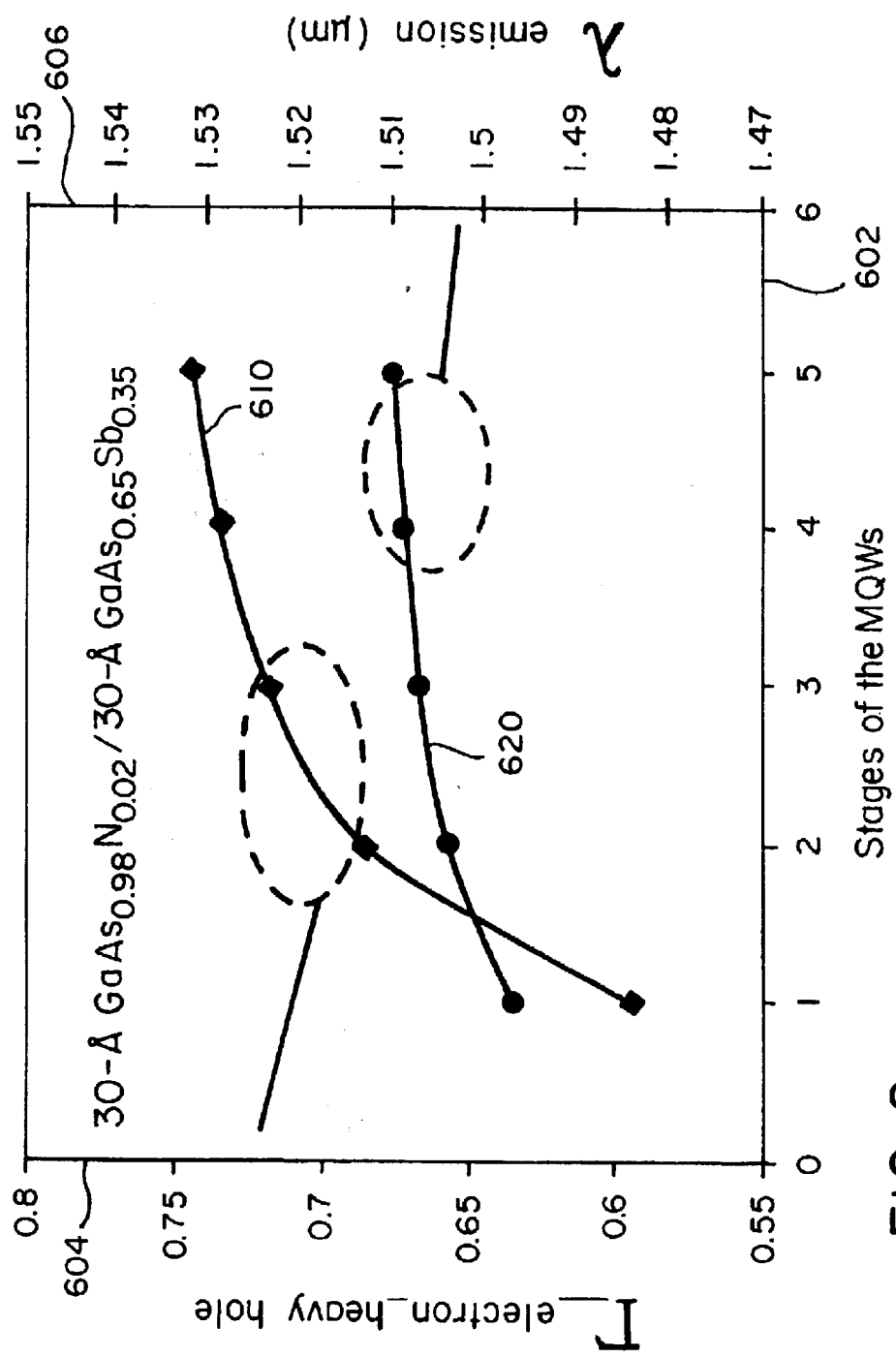
FIG. 8 are graphs showing the relationship between wavefunctions overlap and the number of stages provided in a device having $GaAs_{0.58}N_{0.02}/GaAs_{0.65}Sb_{0.35}/GaAs_{0.98}N_{0.02}$ quantum wells and the relationship between emission wavelength and the number of stages in such a device.

FIG. 8 illustrates the relationship between wavefunction overlap and the number of stages included in a MQW system having approximately 30 Å thick layers of $GaAs_{0.98}N_{0.02}$ and $GaAs_{0.65}Sb_{0.35}$. The abscissa 602 represents the number of stages in the multiple-QW system, a first ordinate 604 represents the electron and heavy-hole wavefunction overlap, and a second ordinate 606 represents the emission wavelength in μm. As shown by the graph 610 in FIG. 8, wavefunction overlap generally increases with an increasing number of stages, with a three-stage QW system having an overlap above approximately 72 percent. FIG. 8 also shows the relationship between emission wavelength and the number of stages provided in a multiple-QW system. As indicated by the graph 620, increasing the number of stages generally increases the emission wavelength. As previously discussed, however, the overall impact of increasing the number of QWs in the system on the emission wavelength is relatively small. For example, as shown in FIG. 8, a single-stage QW system having the composition described above has an emission wavelength of approximately 1.5 μm, while a five-stage QW system has an emission wavelength of approximately 1.51 μm.

Figure 9:
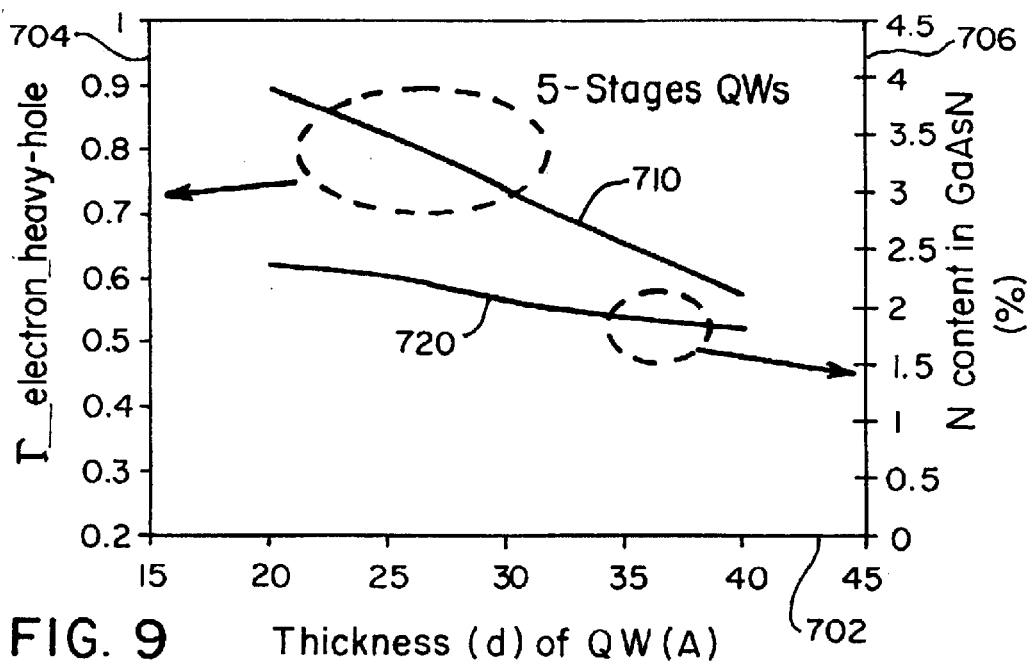
FIG. 9 are graphs showing the relationship between wavefunctions overlap and thickness of quantum well layers in a 5-stage $GaAs_{0.98}N_{0.02}/GaAS_{0.65}Sb_{0.35}/GaAs_{0.98}N_{0.02}$ quantum well device and also showing the relationship between nitrogen content and the thickness of quantum well layers ($d=d_A=d_B$) for an emission wavelength of approximately 1.5 $\mu$m.

Coupling of the electron and heavy-hole wavefunctions may be achieved by reducing the thickness of the individual layers of GaAsN and/or GaAsSb. FIG. 9 illustrates a graph 710 representing the relationship between wavefunction overlap and thickness of the QW layers in a 5-stage QW system having an emission wavelength of 1.5 μm. The abscissa 702 represents the thickness of the QW layers in angstroms, the first ordinate 704 represents the electron and heavy-hole wavefunction overlap, and the second ordinate 706 represents the nitrogen content in the GaAsN QW.

The coupling of the wavefunctions may be optimized as appropriate. The graph 710 generally shows increasing wavefunction overlap with decreasing thickness of QW layers, where the thicknesses of the GaAsN and GaAsSb layers are substantially equal. For example, the graph 710 shows a wavefunction overlap of approximately 89 percent for QW layer thicknesses of 20 Å. The GaAsN and GaAsSb layers may also have different thicknesses.

The graph 720 illustrates a generally increasing N content with decreasing thickness of the GaAsN layer for a 30 Å $GaAs_{1-x}N_x$/30 Angstrom $GaAs_{0.65}Sb_{0.35}$ layer.

The Type II quantum well active region as described above may be incorporated in various semiconductor optoelectronic device structures, including light emitting diodes, laser diodes, amplifiers, gain sections for external cavity lasers, modulators, and photodetectors. For purposes of illustrating the application of the invention, examples of edge emitting and surface emitting laser structures are discussed below.

Figure 10:
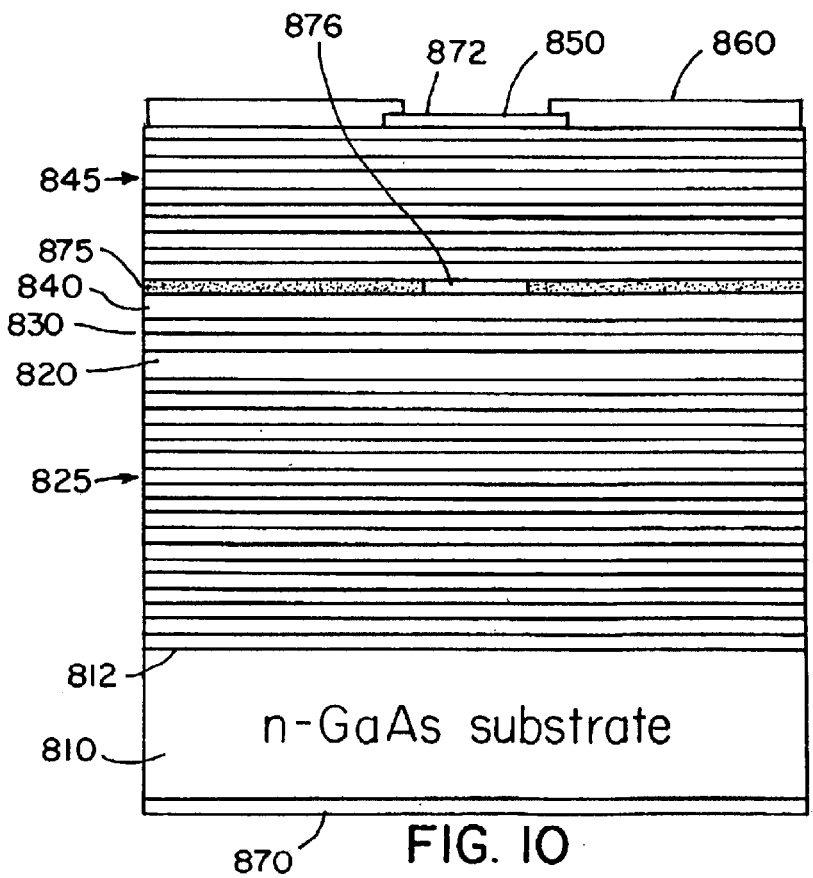
FIG. 10 is a schematic cross-sectional diagram of a vertical cavity surface emitting laser in accordance with an exemplary embodiment of the invention.

FIG. 10 is a schematic cross-sectional view of an example of the present invention embodied in a vertical cavity surface emitting laser (VCSEL) 800. The VCSEL 800 includes a substrate 810 of n-doped GaAs, a lower confinement layer 820 (of, e.g., GaAs or AlGaAs), an active region layer 830 having a multiple quantum well structure and a GaAs barrier layer as described above, an upper confinement layer 840 (of GaAs or AlGaAs) and a capping layer 850 of, e.g., p+-doped GaAs. An upper distributed Bragg reflector (DBR) 845, formed, e.g., of multiple (e.g., 22) alternating layers of AlGaAs/GaAs, and a lower DBR 825 formed, e.g., of multiple (e.g., 40) alternating layers of AlAs/GaAs, provide optical feedback of light in the vertical direction to provide lasing action in the active region. Electrode layers 860 and 870 are formed on the top and bottom surfaces of the structure, respectively, of metal (e.g., Ti/Pt/Al) to provide electrical contacts by which voltage may be applied to the VCSEL 800 to generate lasing in the active region. An aperture or opening 872 is formed in the electrode layer 800 through which a light beam may be emitted. A layer of $AlAs/Al_2O_3$ 875 with an opening 876 therein interposed between the upper confinement layer 840 and the upper DBR 845 to confine current flow through the opening 876 and provide light generation in the active region under the opening. The top surface 812 of the substrate 810 may be oriented in a (100) crystallographic direction, and the various layers formed above the substrate 810 can be epitaxially grown thereon in a conventional fashion. According to alternative embodiments, other crystallographic directions for the top surface 812 and subsequent layers may be used.

The epitaxially-grown layers may be provided above the substrate 810 using metal organic chemical vapor deposition (MOCVD) or molecular beam epitaxy (MBE).

An exemplary active region 830 includes a multiple QW structure having, e.g., 5 QW stages, for a total of 10 layers. As described above, the GaAsN layers form electron QWs, while the GaAsSb layers form hole QWs. Of course, a different number of stages or layers may be used in the active region. For example, six layers may be used to form an active region having three QW stages. According to an exemplary embodiment, the thickness of each of the individual layers in the active region 830 is approximately 30 Å, resulting in a thickness for the active region of approximately 300 Å where a five-stage QW structure is provided. If desired, the thickness of the various active region layers may differ from one another. For example, the GaAsN layers may have a thickness that is greater or less than the thickness of the GaAsSb layers. Both layers in one or more of the stages may have a thickness that is greater or less than the thickness of other stages. The thicknesses and compositions of the layers in the active region may be chosen in accordance with the considerations discussed above.

Figure 11:
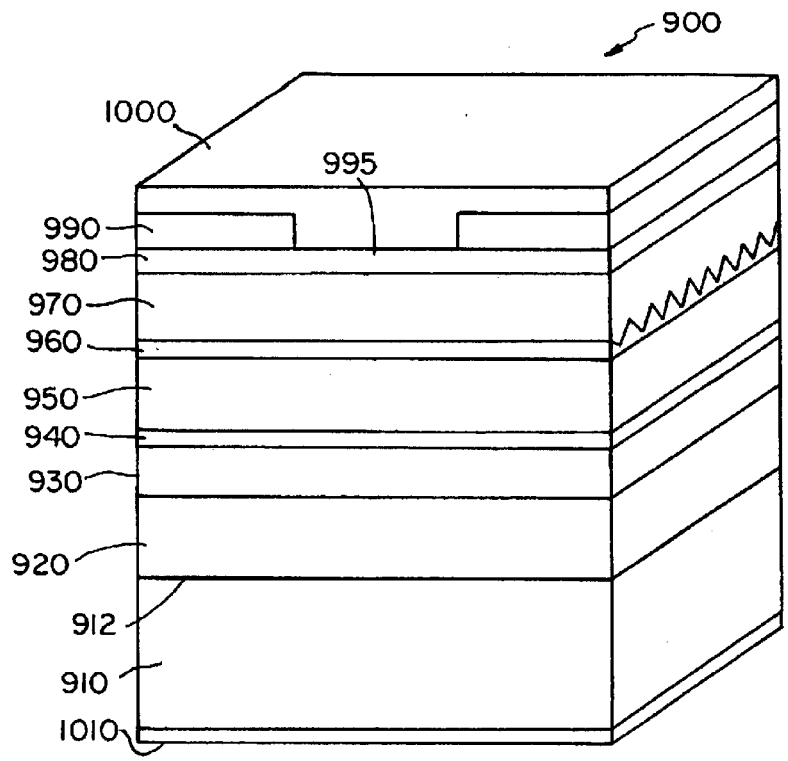
FIG. 11 is a schematic diagram of an edge-emitting laser in accordance with another exemplary embodiment of the invention.

The invention may also be embodied in edge emitting lasers. For purposes of illustration, FIG. 11 shows a schematic diagram of a distributed feedback edge-emitting laser 900 fabricated in accordance with another exemplary embodiment. The laser 900 includes a substrate 910 of n-doped GaAs, a lower cladding layer 920 (e.g., n-doped AlGaAs or n-doped InGaP), a lower optical confinement layer 930 (e.g., GaAs), an active region 940 having a multiple quantum well structure as discussed above, an upper confinement layer 950 (e.g., GaAs), a distributed feedback grating 960 (DFB) formed in the upper confinement layer, an upper cladding layer 970 (e.g., P-AlGaAs or p-InGaP), a capping layer 980 (e.g., p-doped GaAs), an insulating layer 990 (e.g., silicon dioxide), and electrode layers 1000 and 1010 preferably formed of a metal to provide electrical contacts through which voltage may be applied to generate light in the active region 940. Although a distributed feedback grating 960 is illustrated for purposes of providing grated feedback, the present invention may be embodied in lasers having mirrored and semi-mirrored edge facets as discussed below. Lateral current confinement may be provided utilizing an opening 995 in the insulating layer 990 through which current can flow from the electrode 1000. However, other types of gain guiding and/or lateral confinement may be utilized. The top surface 912 of the substrate 910 may be oriented in a (100) crystallographic direction, and the various layers formed above the substrate 910 may be epitaxially grown thereon. According to alternative embodiments, other crystallographic directions for the top surface 912 and subsequent layers may be used. The epitaxially-grown layers may be provided above the substrate 910 using metal organic chemical vapor deposition (MOCVD) or molecular beam epitaxy (MBE).

The active region 940 includes a multiple QW structure having, e.g., 3 QW stages, for a total of 6 layers. As described above, GaAsN layers form electron QWs, while GaAsSb layers form hole QWs. A different number of stages or layers may be used in an active region. For example, ten layers may be used to form an active region having five QW stages. The thickness and composition of each of the layers included in the active region 940 may be chosen based on the factors discussed above.

Figure 12:
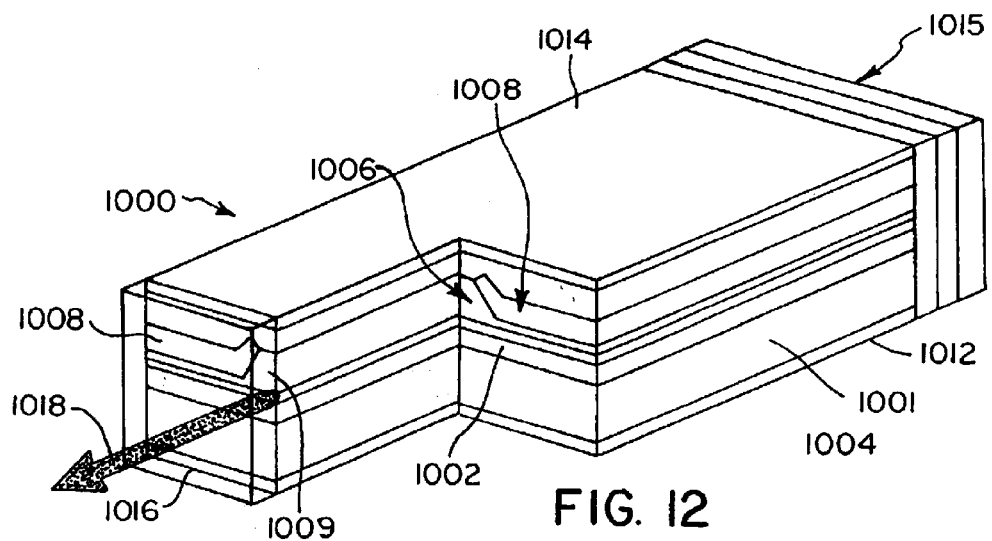
FIG. 12 is a schematic diagram of another embodiment of an edge-emitting laser in accordance with the invention.

An example of an edge emitting Fabry-Perot laser design incorporating the present invention is illustrated generally at 1000 in FIG. 12. The laser 1000 includes a substrate 1001 of GaAs, generally n-doped, an n-doped cladding layer 1002 (e.g., AlGaAs or InGaP), a strained multiple quantum well-single confinement heterostructure (MQW-SCH) active region layer 1004 in accordance with the invention, an upper p-type cladding layer 1006 (e.g., AlGaAs or InGaP), an n-GaAs blocking layer 1008 with a central opening 1009 therein (e.g., P—AlGaAs), and a cap layer 1011 (e.g., P—GaAs). A layer of metal 1012 on the bottom surface of the substrate 1001 provides the lower electrode, and a layer of metal 1014 on the top surface of the cap layer 1011 provides the upper electrode. When voltage is applied between the upper electrode 1014 and the lower electrode 1012, current flows in the opening 1009 in the blocking layer 1008, with current being blocked elsewhere by the n-p junction provided by the blocking layer 1008 and the p-type cladding layer 1006. Optical feedback to provide lasing action in the active region is provided by a high reflection coating mirror 1015 at one of the edge facets and a lower reflection coating 1016 at the other edge facet which provides partial reflection and allows a beam of light 1018 to exit from the edge facet of the laser.

Figure 13:
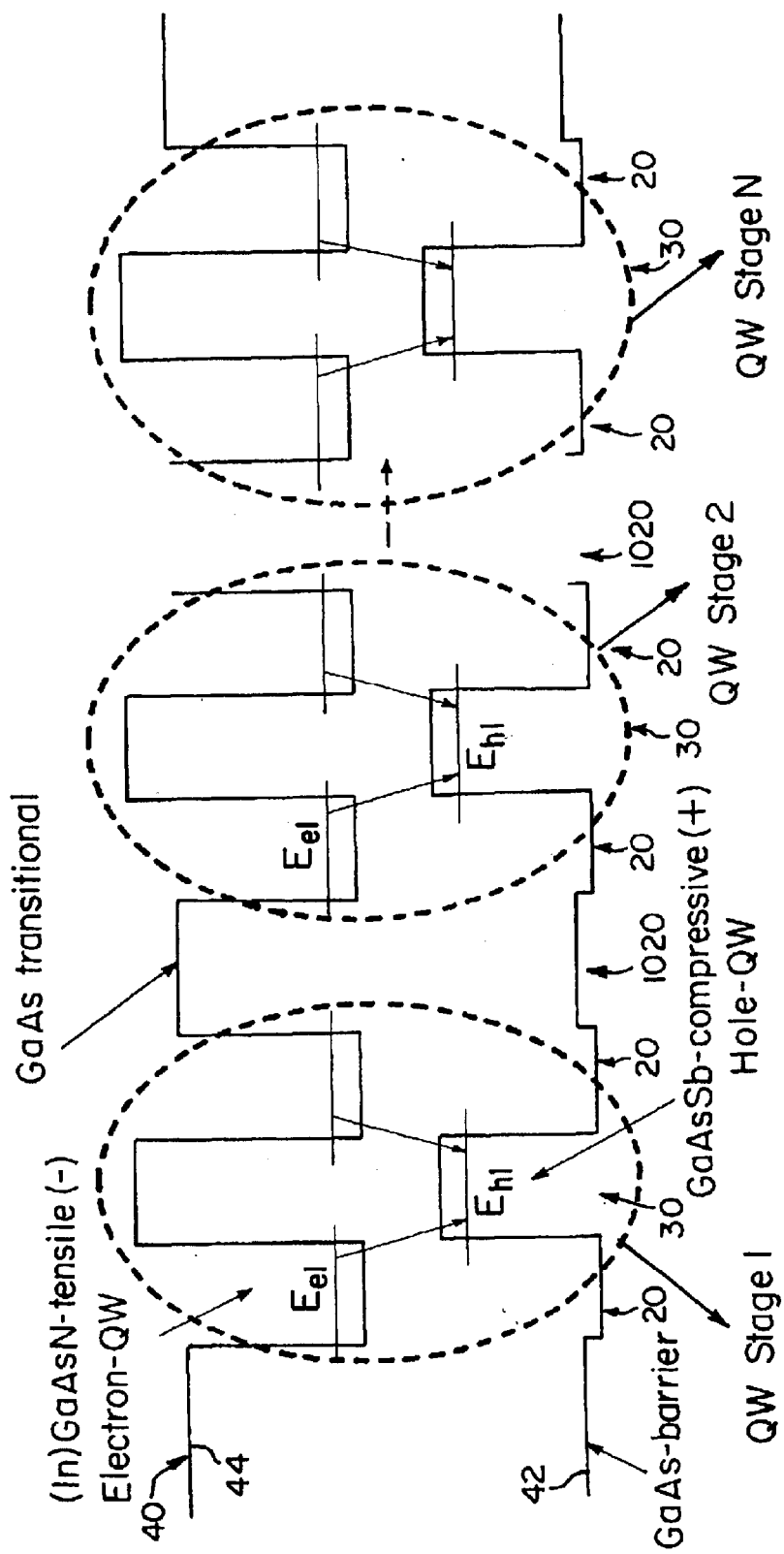
FIG. 13 is a schematic energy band diagram for a multiple stage type II quantum well device having GaAs transitional barriers.

The active region in the present invention may also be embodied in a decoupled quantum well structure, as illustrated in FIG. 13. The electron quantum well layers 20 and hole quantum well layers 30 are formed as discussed above with respect to FIG. 2. However, an additional high-bandgap layer 1020 of a material such as GaAs may be utilized between the GaAsN/GaAsSb sections to separate them, as illustrated in FIG. 13. This separation preserves the two-dimensional behavior of the individual quantum well sections. If the GaAsN/GaAsSb quantum well sections are strongly coupled, they behave more like a bulk active layer and thereby lose certain of the benefits of a two-dimensional structure. The tradeoff incurred in using the additional high bandgap layer 1020 is a lower wavefunction overlap between electron and hole because the quantum well sections are decoupled.

Figure 14:
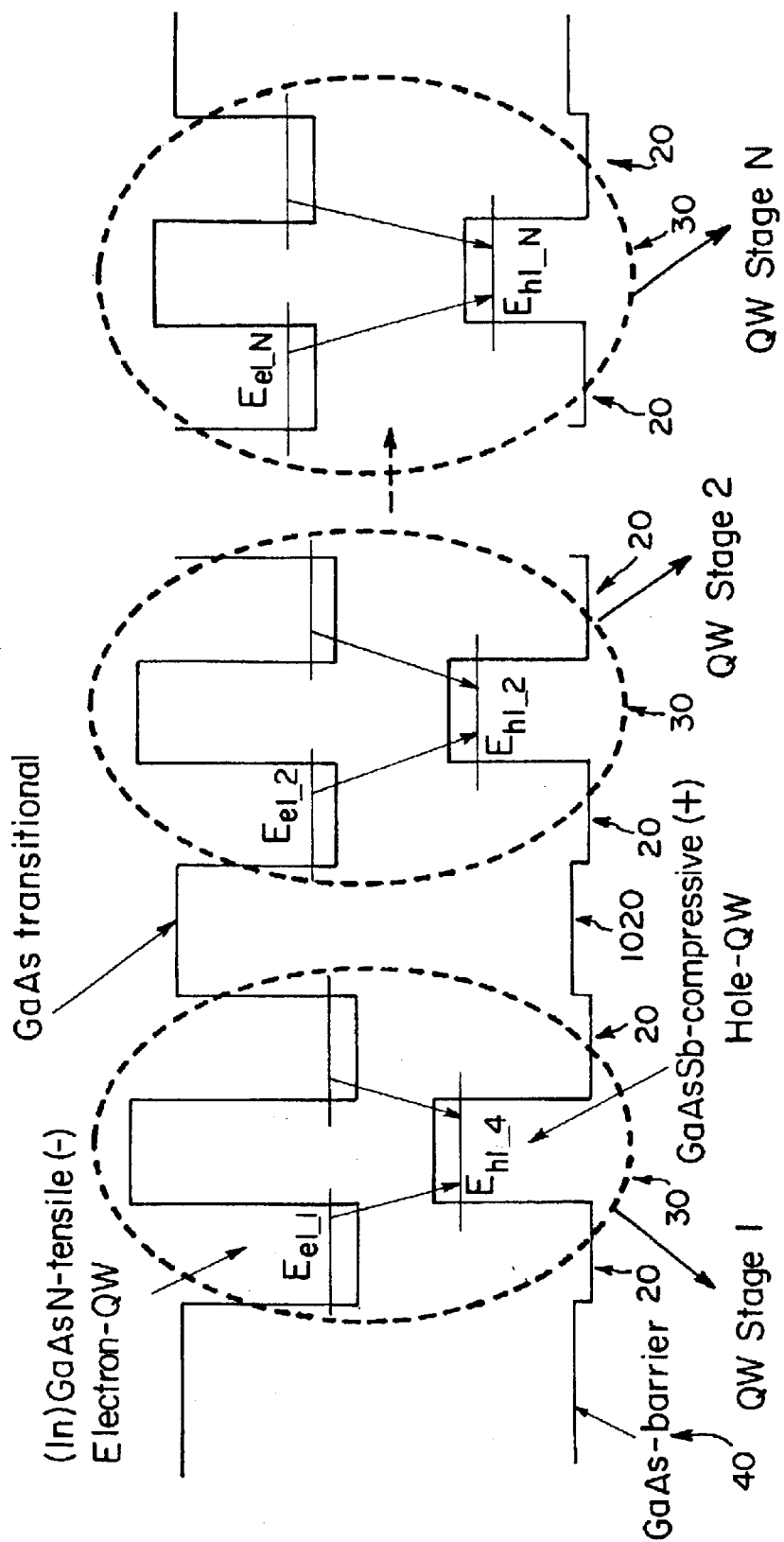
FIG. 14 is a schematic energy band diagram for a multiple stage type II quantum well device having a chirped or graded change in composition of the quantum wells transversely through the set of quantum wells.

The composition of the GaAsN/GaAsSb materials of the quantum wells may be chirped or graded in the transverse direction across the set of quantum wells to change the energy levels of the conduction band and valence band of each of the quantum wells, as illustrated in FIG. 14. Chirping or grading the composition of the quantum wells in this fashion provides the potential for a broad gain spectrum.

Figure 15:
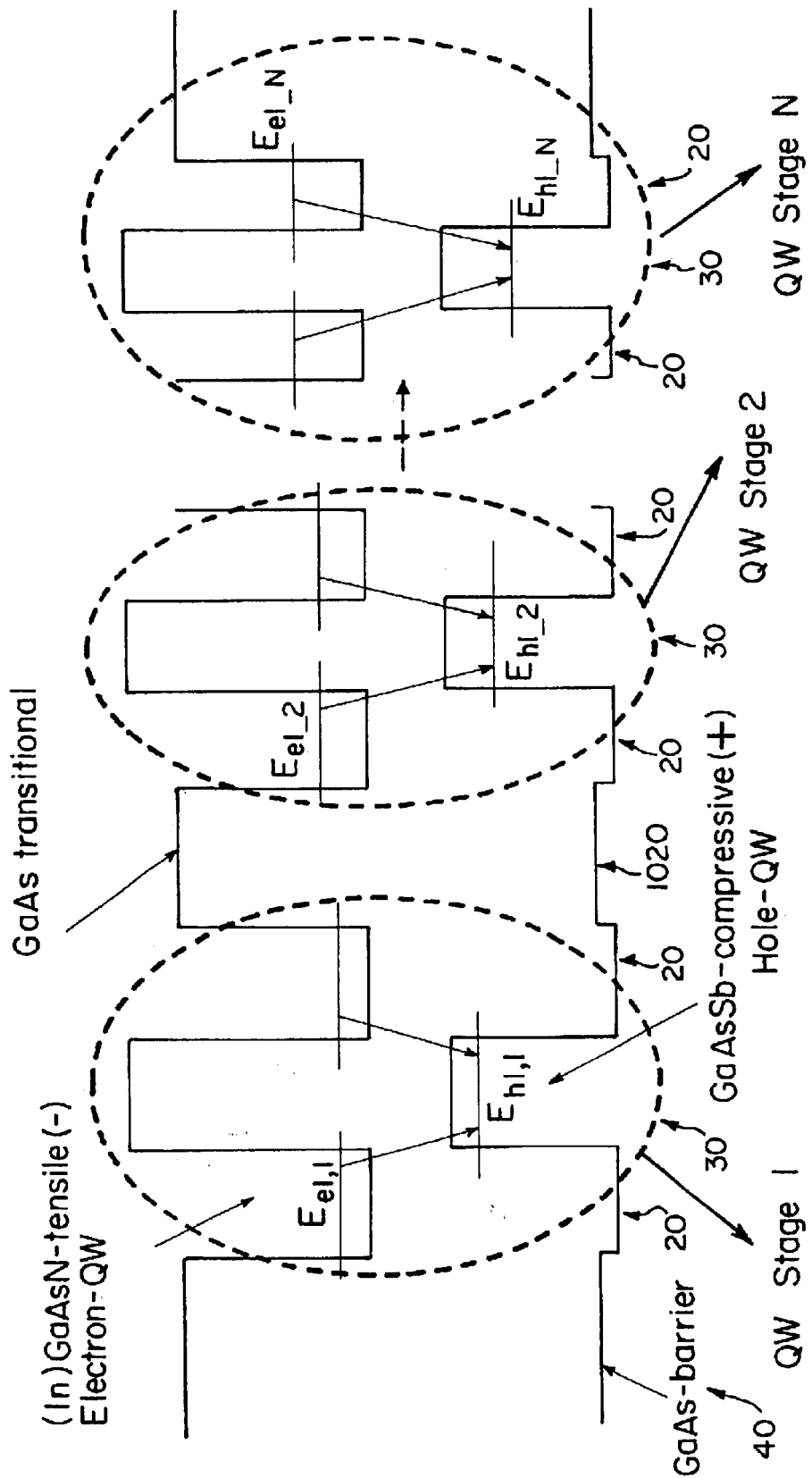
FIG. 15 is a schematic energy band diagram for a multiple stage type II quantum well device having a chirped or graded change in quantum well dimensions transversely through the set of quantum wells.

The thickness of the GaAsN/GaAsSb layers in the quantum wells may also be chirped or graded in the transverse direction from quantum well to quantum well, is illustrated in FIG. 15. Chirping or grading the thickness of the quantum well layers in this fashion also provides the potential for a broad gain spectrum. A large spectral gain bandwidth obtained by grading the thickness or material of the quantum wells is a useful feature for amplifiers or gain sections in external cavity tunable lasers.

As previously indicated, the present invention having the active region as discussed above may be embodied in various types of optoelectronic devices and is not limited to diode lasers. Examples of such other devices include light emitting diodes, amplifiers, and gain sections for external cavities. Such devices may have structures similar to those discussed above for exemplification with respect to diode lasers but without structures for providing optical feedback for lasing action.

Implementation of GaAsN—GaAsSb active regions into vertical cavity surface emitting lasers (VCSELs), grating coupled surface emitting lasers, and edge-emitting lasers allows for production of monolithic, lower cost, longer wavelength (e.g., 1.3 to 1.55 $\mu$m or longer, etc.) sources, as compared with conventional lasers. Strong carrier confinement (for low device temperature sensitivity), large overlap of electron-hole wavefunctions (for high gain), and ability to implement strain compensation (for multiple QW active designs) also may be achieved through the use of GaAsN—GaAsSb active regions in accordance with the invention.

It should be understood that the invention is not limited to the embodiments set forth herein as illustrative, but embraces all such forms thereof as come within the scope of the following claims.

What is claimed is:

1. An optoelectronic device comprising:
a multilayer semiconductor structure including a GaAs substrate and an active region, the active region comprising at least a hole quantum well layer of GaAsSb and electron quantum well layers adjacent to the hole quantum well layer at least one of which comprises GaAsN to provide a type II quantum well structure, wherein the electron quantum well layers and hole quantum well layer form a first quantum well stage, and wherein the active region comprises a plurality of quantum well stages adjacent to each other having the same structure as the first quantum well stage, and including a transitional layer of GaAs between each quantum well stage.

2. The device of claim 1 wherein the electron quantum well layers are in tensile strain and the hole quantum well layer is in compressive strain.

3. The device of claim 1 wherein the thickness of each electron quantum well layer and the hole quantum well layer is between approximately 20 and 50 angstroms.

4. The device of claim 1 including a barrier layer adjacent to the GaAsN electron quantum well layer.

5. The device of claim 4 wherein the barrier layer material comprises GaAs.

6. The device of claim 1 wherein the antimony content of the hole quantum well layer is approximately 35 molar percent.

7. The device of claim 1 wherein the multilayer semiconductor structure forms a vertical cavity surface emitting laser.

8. The device of claim 1 wherein the multilayer semiconductor structure forms an edge-emitting laser.

9. The device of claim 1 wherein the active region generates light having a wavelength greater than approximately 1.3 $\mu$m.

10. The device of claim 1 wherein the active region generates light having a wavelength of approximately 1.55 $\mu$m.

11. The device of claim 1 wherein at least one of the electron quantum well layers includes indium therein to provide an InGaAsN electron quantum well layer.

12. An optoelectronic device comprising:
a multilayer semiconductor structure including a GaAs substrate and an active region, the active region comprising at least a hole quantum well layer of GaAsSb and electron quantum well layers of GaAsN adjacent to the hole quantum well layer to provide a type II quantum well structure, wherein the electron quantum well layers are in tensile strain and the hole quantum well layer is in compressive strain, wherein the electron quantum well layers and hole Quantum well layer form a first quantum well stage, and wherein the active region comprises a plurality of quantum well stages adjacent to each other having the same structure as the first quantum well stage, and including a transitional layer of GaAs between each Quantum well stage.

13. The device of claim 12 wherein the thickness of each of the electron quantum well layer and the hole quantum well layer is between approximately 20 and 50 angstroms.

14. The device of claim 12 including a barrier layer adjacent to a GaAsN electron quantum well layer.

15. The device of claim 12 wherein the antimony content of the hole quantum well layer is approximately 35 molar percent.

16. An optoelectronic device comprising:
a multilayer semiconductor structure including a GaAs substrate and an active region, the active region comprising at least a hole quantum well layer of GaAsSb and electron quantum well layers adjacent to the hole quantum well layer at least one of which comprises InGaAsN to provide a type II quantum well structure.

17. The device of claim 16 wherein the electron quantum well layers are in tensile strain and the hole quantum well layer is in compressive strain.

18. The device of claim 16 wherein the InGaAsN layer is lattice matched to GaAs.

19. The device of claim 16 wherein the thickness of each of the electron quantum well layers and the hole quantum well layer is between approximately 20 and 50 angstroms.

20. The device of claim 16 including a barrier layer adjacent to the GaAsN electron quantum well layer.

21. The device of claim 16 wherein the electron quantum well layers and hole quantum well layer form a first quantum well stage, and wherein the active region comprises a plurality of quantum well stages adjacent to each other having the same structure as the first quantum well stage.

22. The device of claim 21 including a transitional layer of GaAs between each quantum well stage.

23. A semiconductor laser comprising:
(a) a multilayer semiconductor structure including a GaAs substrate and an active region, the active region comprising at least a hole quantum well layer of GaAsSb and electron quantum well layers adjacent to the hole quantum well layer at least one of which comprises InGaAsN to provide a type II quantum well structure; and
(b) means for providing optical feedback to provide lasing action in the active region.

24. The laser of claim 23 wherein the electron quantum wells layer are in tensile strain and the hole quantum well layer is in compressive strain.

25. The laser of claim 23 wherein the thickness of each of the electron quantum well layer and the hole quantum well layer is between approximately 20 and 50 angstroms.

26. The laser of claim 23 including a barrier layer adjacent to the GaAsN electron quantum well layer.

27. The laser of claim 23 wherein the electron quantum well layer and hole quantum well layer form a first quantum well stage, and wherein the active region comprises a plurality of quantum well stages adjacent to each other having the same structure as the first quantum well stage.

28. The laser of claim 27 including a transitional layer of GaAs between each quantum well stage.

29. The laser of claim 23 wherein the antimony content of the hole quantum well layer is approximately 35 molar percent.

30. The laser of claim 23 wherein the multilayer semiconductor structure forms a vertical cavity surface emitting laser.

31. The laser claim 23 wherein the multilayer semiconductor structure forms an edge-emitting laser.

32. The laser of claim 23 wherein the active region generates light having a wavelength greater than approximately 1.3 $\mu$m.

33. The laser of claim 23 wherein the active region generates light having a wavelength of approximately 1.55 $\mu$m.

* * * * *